United States Patent
Gustavsson et al.

(10) Patent No.: US 6,268,815 B1
(45) Date of Patent: Jul. 31, 2001

(54) HIGH PERFORMANCE SWITCHED-CAPACITOR FILTER FOR OVERSAMPLING SIGMA-DELTA DIGITAL TO ANALOG CONVERTERS

(75) Inventors: Mikael Gustavsson, Eatontown; Nianxiong Tan, Howell, both of NJ (US)

(73) Assignee: Globespan, Inc., Red Bank, NJ (US)

( * ) Notice: Subject to any disclaimer, the term of this patent is extended or adjusted under 35 U.S.C. 154(b) by 0 days.

(21) Appl. No.: 09/517,979

(22) Filed: Mar. 3, 2000

Related U.S. Application Data
(60) Provisional application No. 60/139,205, filed on Jun. 15, 1999.

(51) Int. Cl.$^7$ .................................. H03M 3/00
(52) U.S. Cl. ........................................... 341/143
(58) Field of Search ..................... 341/143, 152, 341/157, 144

(56) References Cited

U.S. PATENT DOCUMENTS

| | | | |
|---|---|---|---|
| 5,212,659 | * 5/1993 | Scott et al. | 708/313 |
| 5,489,903 | * 2/1996 | Wilson et al. | 341/144 |
| 5,982,229 | 11/1999 | Wong et al. | 327/554 |
| 5,982,317 | 11/1999 | Steensgaard-Madsen | 341/143 |
| 5,990,819 | 11/1999 | Fujimori | 341/150 |
| 6,035,320 | 3/2000 | Kiriaki et al. | 708/819 |
| 6,040,793 | 3/2000 | Ferguson, Jr. et al. | 341/143 |
| 6,081,218 | 6/2000 | Ju et al. | 341/150 |
| 6,087,969 | 7/2000 | Stockstad et al. | 341/143 |
| 6,087,970 | 7/2000 | Panicacci | 341/172 |
| 6,191,648 | * 2/2001 | Lewicki | 327/554 |

OTHER PUBLICATIONS

Hurst et al., Finite impulse response switched–capacitor decimation filters for the DSM D/A interface, 1989 IEEE International Symposium on Circuits and Systems, May 8–11, 1989, vol. 3, pp. 1688–1691.*

Gulati et al., A High–Swing CMOS Telescopic Operational Amplifier, IEEE Journal of Solid–State Circuits, vol. 33, No. 12, Dec. 1998, pp. 2010–2019.*

* cited by examiner

*Primary Examiner*—Howard L. Williams
(74) *Attorney, Agent, or Firm*—Thomas, Kayden, Horstemeyer & Risley

(57) ABSTRACT

An improved SC filter for OSDACs for asynchronous digital subscriber line (ADSL) applications. More specifically, an improved switched-capacitance (SC) filter for an oversampled digital to analog converter intended for use in a multi-mode analog front end for a host of ADSL applications. The SC filter is configured for low power consumption and for a low-ambient noise floor across the frequencies of interest. The SC filter is further configured to drive a resistive load of a few kohms and for low signal distortion. The SC filter lowers power consumption by decimating the input waveform and reducing the number of operational amplifiers in the circuit.

14 Claims, 9 Drawing Sheets

HIGH PERFORMANCE SWITCHED-CAPACITOR FILTER FOR OVERSAMPLING SIGMA-DELTA DIGITAL TO ANALOG CONVERTERS

CROSS-REFERENCE TO RELATED APPLICATION

The present application claims the benefit of U.S. provisional patent application, serial No. 60/139,205, filed Jun. 15, 1999, which is hereby incorporated by reference in its entirety.

BACKGROUND OF THE INVENTION

1. Field of the Invention

The present invention generally relates to high speed data communications wherein signal information is processed both in digital and analog forms. More specifically, the invention is related to a digital to analog data converter integrated circuit, which solves problems associated with integration density, power consumption, and data transmission protocol compatibility for central office digital subscriber line circuit cards.

DISCUSSION OF THE RELATED ART

2. Digital Subcriber Line Applications

With the advancement of technology, and the need for instantaneous information, the ability to transfer digital information from one location to another, such as from a central office to customer premises, has become more and more important.

In a digital subscriber line (DSL) system, data is transmitted from a central office to customer premises via a transmission line, such as a two-wire pair, and is transmitted from the customer premise to the central office as well, either simultaneously or in different communication sessions. The same transmission line might be utilized for data transfer by both sites or the transmission to and from the central office might occur on two separate lines. In its most general configuration, a DSL card at a central office is comprised of a digital signal processor (DSP) which receives information from a data source and sends information to an analog front-end (AFE). The AFE serves as the interface between an analog line, such as the two-wire pair, and the DSP. The AFE functions to convert digital data, from the DSP, into a continuous time analog signal when processing downstream data. Conversely, the AFE serves to convert an analog signal to digital data when processing upstream data.

As an important part of the aforementioned system responsible for proper transmission and reception of data in a broadband network, the AFE performs multiple functions in addition to converting a digital signal into a continuous time analog signal. However, the functionality of the AFE is particular to the specific DSL application considered, wherein factors such as signal bandwidth, data rate, data reach, signal quality, power budget, and different applicable standards determine the optimum AFE. In order to minimize application specific implementations of digital to analog converters across the many DSL applications, it is desired to create a high-performance configurable digital to analog converter.

Considering the many flavors of DSL applications, the adaptability problem becomes more apparent. Focusing on ADSL applications, there are a number of different implementation standards available including: DMT-FDM, DMT-EC, G.lite, CAP-RADSL, and ADSL over ISDN, hereinafter the aforementioned ADSL applications will be denoted xDSL. For each application, the optimum AFE configuration varies. Subsequently, the digital to analog converter (DAC) implementation for each separate AFE configuration must vary appropriately.

SIGMA-DELTA MODULATION

Sigma-Delta modulation is a method used to perform both analog to digital and digital to analog conversions. It uses the concept of over-sampling and digital signal processing in order to achieve high resolution of the desired signal bandwidth. Various Sigma-Delta architectures exist with many used in instrumentation, speech, high-fidelity audio digitization, digital cellular radio, and integrated services digital network (ISDN) applications. Sigma-Delta modulation may also be employed to perform analog to digital (ADC) and digital to analog conversions (DAC) for higher frequency signals in a variety of communications systems, such as xDSL applications.

A Sigma-Delta based DAC is a common choice when both high resolution and low distortion are desired. The high resolution and low distortion requirements in xDSL applications make the Sigma-Delta architecture a natural starting point for high performance DAC designs. However, the Sigma-Delta methodology presents some problems when adapted to xDSL applications.

Most of the published Sigma-Delta DACs are used in audio applications where the signal bandwidth of interest is approximately 20 kHz. In audio applications, a high oversampling ratio can be easily achieved. In xDSL applications, the signal bandwidth of interest increases from 20 kHz to approximately 1 MHz. Conversion of the Sigma-Delta DAC from an audio application to a xDSL application requires an increase in the sampling rate that makes designing for low power consumption and low signal distortion difficult. Decimating the input signal to the switched-capacitor (SC) filter reduces the speed requirements, but requires an additional finite impulse response (FIR) filter and an operational-amplifier (op-amp). As a result, prior art DACs in xDSL applications have not achieved the signal bandwidth requirements of multiple xDSL applications in a power-efficient manner.

SUMMARY OF THE INVENTION

In light of the foregoing, the invention is a high-performance switched-capacitor (SC) filter for oversampling digital to analog converters (OSDACs) that accommodates multiple xDSL applications in a power efficient manner, by eliminating an op-amp, avoiding signal dependent loads on reference buffers, and sharing an op-amp within the AFE. The improvements to the OSDAC of the present invention are implemented within a SC filter. More specifically, the SC filter of the present invention removes an op-amp from a SINC filter; avoids signal dependent loads on the reference buffers by increasing input signal swing through a combination of using the positive and negative voltage references with switch control of the bottom capacitor plates in the SC filter; and shares an op-amp from a sample and hold buffer to drive a smoothing filter.

In general, the preferred embodiment of the invention utilizes a SINC filter, a SC-biquad filter, and a sample and hold buffer. The SINC filter decimates the input signal by a factor of four. The SC-biquad filter tracks the input and filters out high frequency noise generated by the Sigma-Delta modulator while adding minimal distortion to the signal. Finally, the sample and hold buffer serves to create a low-distortion analog waveform and to drive the resistive load of an analog smoothing filter within the AFE.

An advantage of the invention is that it provides a low cost solution to providing a high performance DAC, which will serve multiple xDSL applications.

Another advantage associated with implementation of the present invention is that, it saves power by sharing an op-amp between the SINC filter and the SC-biquad input interface. It further reduces power requirements by removing an op-amp typically used to drive an analog smoothing filter.

A further advantage of the invention is that the DAC avoids signal dependent loading on the reference buffers by making the digital signal from the Sigma-Delta modulator control the switches at the op-amp input individually for each SINC tap in the SINC filter.

Other objects, features, and advantages of the present invention will become apparent to one of reasonable skill in the art upon examination of the following drawings and detailed description. It is intended that all such additional objects, features, and advantages be included herein within the scope of the present invention, as defined by the claims.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE INVENTION

Figure 1:
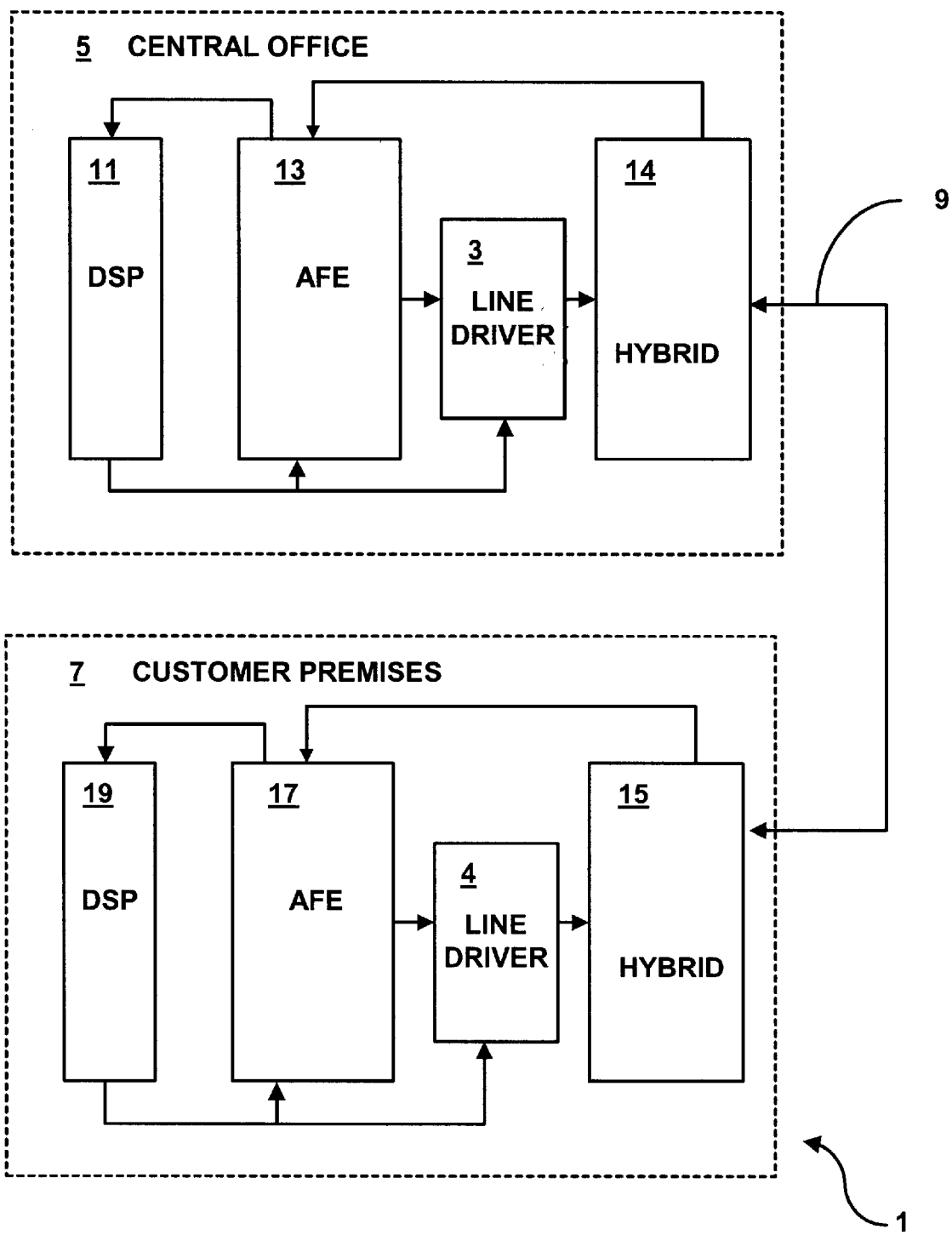
FIG. 1 is a prior art top-level representation of a typical digital subscriber line system utilizing a digital signal processor, an analog front-end, a line driver, and a hybrid.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims. Turning now to the drawings, wherein like referenced numerals designate corresponding parts throughout the drawings, FIG. 1 shows a prior art top level representation of a typical xDSL system 1 utilizing an AFE which is separate from a line driver and a hybrid. The xDSL system 1 illustrates transmission of data from a central office 5 to a customer premises 7 via a transmission line 9, such as, but not limited to, a two-wire pair, and transmission of data from the customer premises 7 to the central office 5. With regard to the present illustration, transmission of data may be directed from the customer premises 7 to the central office 5, from the central office 5 to the customer premises 7, or in both directions simultaneously.

Further, transmission of data can either flow on the same line in both directions, or on separate lines, one in each direction.

The central office 5 includes a line card that includes a DSP 11, which receives and sends information through AFE 13. AFE 13 serves as the interface between DSP 11 where all signals are represented in their digital form and the remainder of the xDSL equipment where signals are analog in nature. AFE 13 converts digital signals from DSP 11 into a continuous analog signal for downstream data transmission via the two-wire pair 9. In addition, AFE 13 converts analog signals received from central office 5 into a digital data stream for upstream data transmission to DSP 11.

The analog signal is delivered, via a line driver 3, in accordance with the amount of power required to drive the amplified analog signal through the two-wire pair 9 along to customer premises 7. The hybrid 15, located in the customer premises 7, is then used to de-couple the received signal from the transmitted signal, by subtracting the transmitted signal from the sum of the transmitted and received signals. The AFE 17, located in the customer premises 7, then converts the received analog signal into a digital signal, which is then transmitted to DSP 19 located in the customer premises 7. Finally, the digital information is transmitted to the data source specified to receive the information.

If an analog signal is delivered from the customer premises 7 to the central office 5, line driver 4 will deliver the signal in accordance with the amount of power required to drive the amplified analog signal through the two-wire pair 9 and to the central office 5. A hybrid 14, located in the central office 5, is then used to de-couple the received signal from the transmitted signal, by subtracting the transmitted signal from the sum of the transmitted and received signal. AFE 13, located in the central office 5, then converts the received analog signal into a digital signal, which is then transmitted to DSP 11 located in the central office 5. Finally, the digital information is transmitted to the destination unit specified to receive the information.

Figure 2:
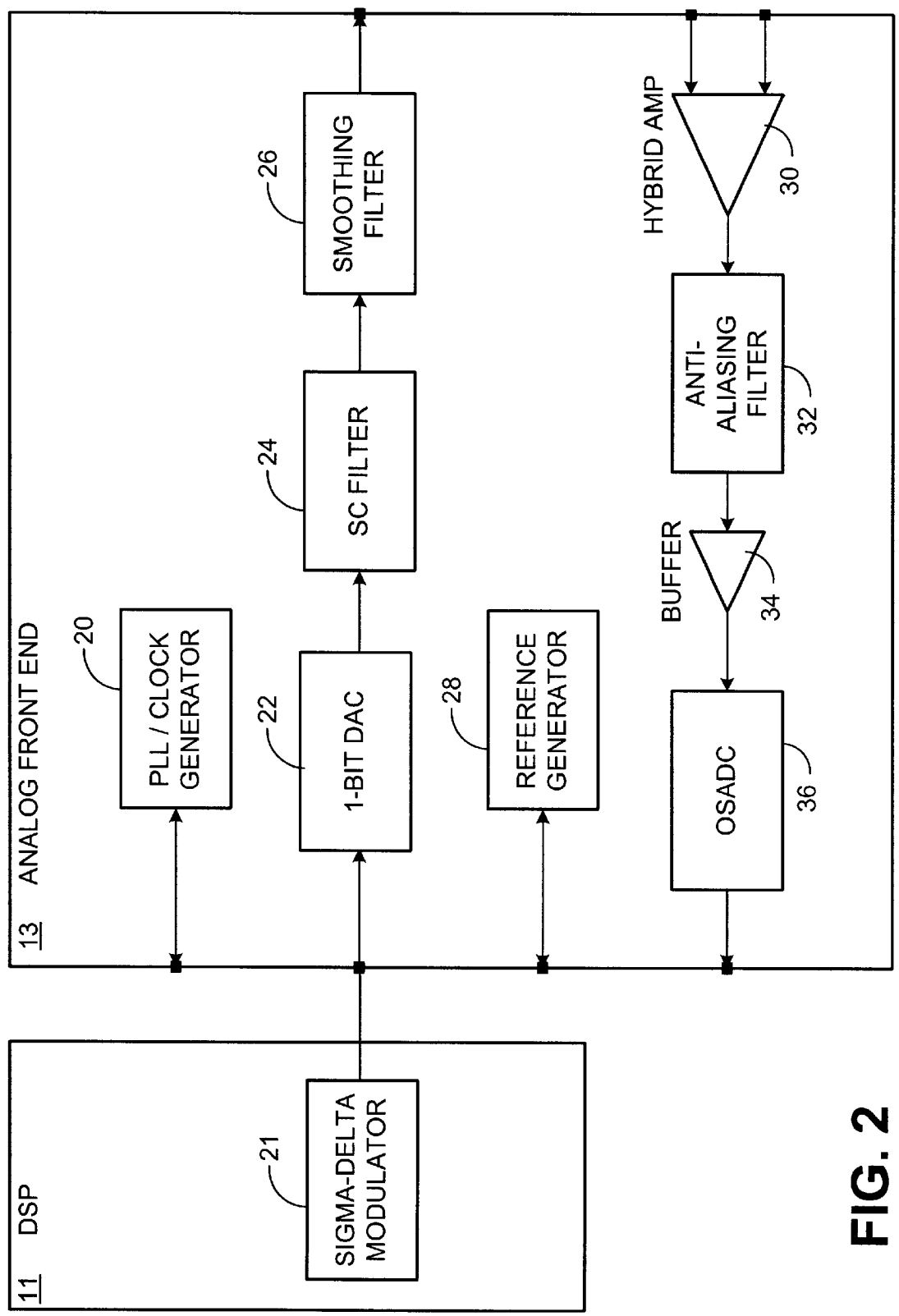
FIG. 2 is a block diagram that depicts a general analog front-end circuit based on OSADC and OSDAC used in xDSL applications.

Referring now to FIG. 2, an AFE 13 in accordance with the preferred embodiment of the invention is illustrated. Hybrid amp 30 receives both the upstream signal from the customer premises and the transmitted downstream signal from the central office. Hybrid amp 30 and external components (not shown) are configured to de-couple the received signal from the transmitted signal, by subtracting the transmitted signal from the sum of the transmitted and received signals.

Anti-Aliasing filter (AAF) 32 and buffer 34 are configured to provide a low-pass filter with an adjustable cut-off frequency tailored to the particular xDSL application desired. The cut-off frequency is determined by the combination of a resistor and capacitor in a manner well known by those skilled in the art. Buffer 34 is required to drive the switched-capacitor load at the over-sampling analog to digital converter (OSADC) input.

The OSADC 36 samples the received signal at a rate much higher than the Nyquist sampling rate. OSADC 36 provides a high-resolution, low-distortion digital representation of the received upstream information signal to the xDSL DSP 11.

Reference generator 28 and phase locked-loop (PLL)/clock generator 20 provide the necessary baseline signals that coordinate and direct operation of the AFE functional blocks responsible for analog to digital signal conversion and conversely, the digital to analog data conversion. PLL/clock generator 20 generates a clock used in the SC filter 24 by dividing the frequency of the input signal by a predetermined decimating factor. In addition, PLL/clock generator 20 creates the clock phases needed in the SC filter 24. The implementation and application of reference generator 28 and PLL/clock generator 20 throughout AFE 13 is understood by those skilled in the art and need not be described in detail herein.

Having briefly described the analog to digital conversion process in AFE 13 at a functional block level, reference is now made to the digital to analog signal conversion process therein. In this regard, the digital Sigma-Delta modulator 21 in DSP 11 converts a high-resolution digital signal into an oversampled 1-bit signal. This 1-bit data stream contains high-frequency quantization noise, which must be removed by a low-pass filter. The 1-bit DAC 22 receives the serial stream of digital data from the digital Sigma-Delta modulator in DSP 11. The 1-bit DAC 22 translates the binary number received into an analog signal which is low-pass filtered by SC filter 24. To remove images caused by the sample and hold function of the SC filter 24, the signal from SC filter 24 is further low-pass filtered by the continuous-time smoothing filter 26.

In order to accurately transform the digital pulse train into a continuous time analog signal without adding undesirable levels of noise and distortion, SC filter 24 first decimates the sample rate used in the digital Sigma-Delta modulator by a predetermined factor. Next, SC filter 24 removes part of the quantization noise generated in the Sigma-Delta modulator at the lower decimated sampling rate. Finally, SC filter 24 uses a sample and hold buffer to further process the analog information signal before sending the signal to smoothing filter 26.

The output of the smoothing filter 26 can either go directly to the line driver 3 (see FIG. 1), as is the case when both the transmission and reception of information is performed in the same bandwidth, or to an external transmit filter (not shown), as is the case when transmission and reception of data is performed in different bandwidths.

If the analog signal is transmitted to an external transmit filter, the external transmit filter removes out-of-band noise and distortion from the transmit-frequency band which falls into the receive-frequency band. As by way of example, if the frequency band allocated for transmission of the analog signal encompasses the range of 201 to 400 kHz and the frequency band allocated for reception of the analog signal encompasses the range of 50 to 200 kHz, the filter, driven by a transmit buffer, filters the transmit-signal in the frequency range from 50 to 200 kHz.

Figure 3:
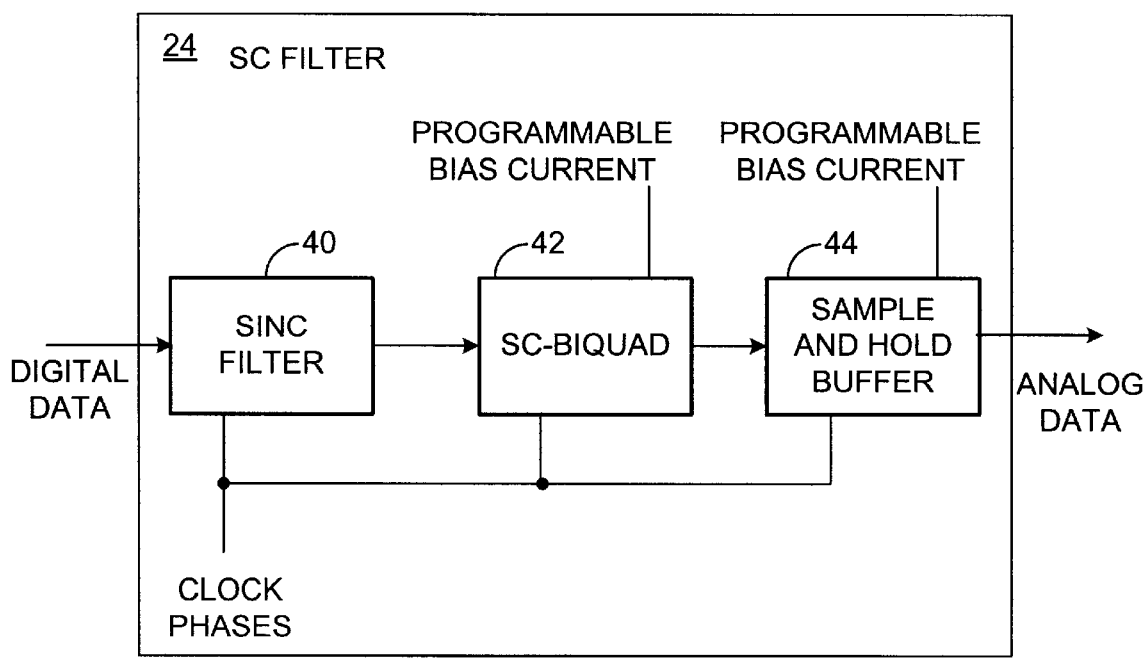
FIG. 3 is a block diagram that illustrates the functional elements of the SC filter of the present invention.

Having described operation of the analog front end illustrated in FIG. 2, reference is now directed to FIG. 3. In this regard, FIG. 3 is a block diagram that illustrates the three functional stages of SC filter 24. When a data signal is transmitted from DSP 11 to the AFE 13 (see FIG. 1), the DSP 11 encodes the data with a Sigma-Delta modulator to enable generation of high-resolution waveforms in the AFE 13. During encoding there is the dilemma of trading off signal bandwidth versus signal resolution by selecting an appropriate over-sampling ratio. As an example, if the Sigma-Delta modulator samples at 64 MHz, a signal bandwidth of 1 MHz may be used with an over-sampling rate (OSR) of 32, or a signal bandwidth of 500 kHz may be used with an OSR of 64. Selecting the higher OSR would significantly improve the signal quality up to 500 kHz, while significantly degrading the signal quality from 500 kHz to 1 MHz. Thus, it is important to select the OSR in accordance with the different xDSL applications and various bandwidths confronted by the AFE 13.

Therefore, in accordance with the preferred embodiment of the invention, the SC filter 24 contains a programmability feature which tracks the OSR utilized by the DSP 11 and adopts the cut-off frequency of the SC filter 24 accordingly. In order to take full advantage if this feature, the cut-off frequency of the SC filter 24 tracks the inverse of the OSR according to the following equation:

$$BW = \frac{F_S}{2 \cdot OSR},$$

where, $F_s$ is the sampling frequency of the digital Sigma-Delta modulator, OSR is the over-sampling ratio of the modulator, and BW is the bandwidth allocated for the data signal, or cut-off frequency of the SC filter 24. The bandwidth of the SC filter 24 may be changed by adjusting the sampling frequency of the SC filter 24 and/or the capacitance of the capacitors used in the SC filter 24.

SINC filter 40 performs both digital to analog conversion and SINC filtering by using switched-capacitors. SINC filter 40 may be configured to decimate the digital data signal by a predetermined factor such that both the digital to analog conversion and the SINC filtering may be performed at the lower decimated rate. SC-biquad 42 receives the signal from the SINC filter and removes some of the high frequency noise generated in the digital Sigma-Delta modulator. The sampling rate of SC-biquad 42 is the lower decimated rate. SC-biquad 42 then provides a first stage analog representation of the data signal to the sample and hold buffer 44. The sample and hold buffer 44 generates a low-distortion continuous time analog signal and drives smoothing filter 26 (see FIG. 2).

Figure 4A:
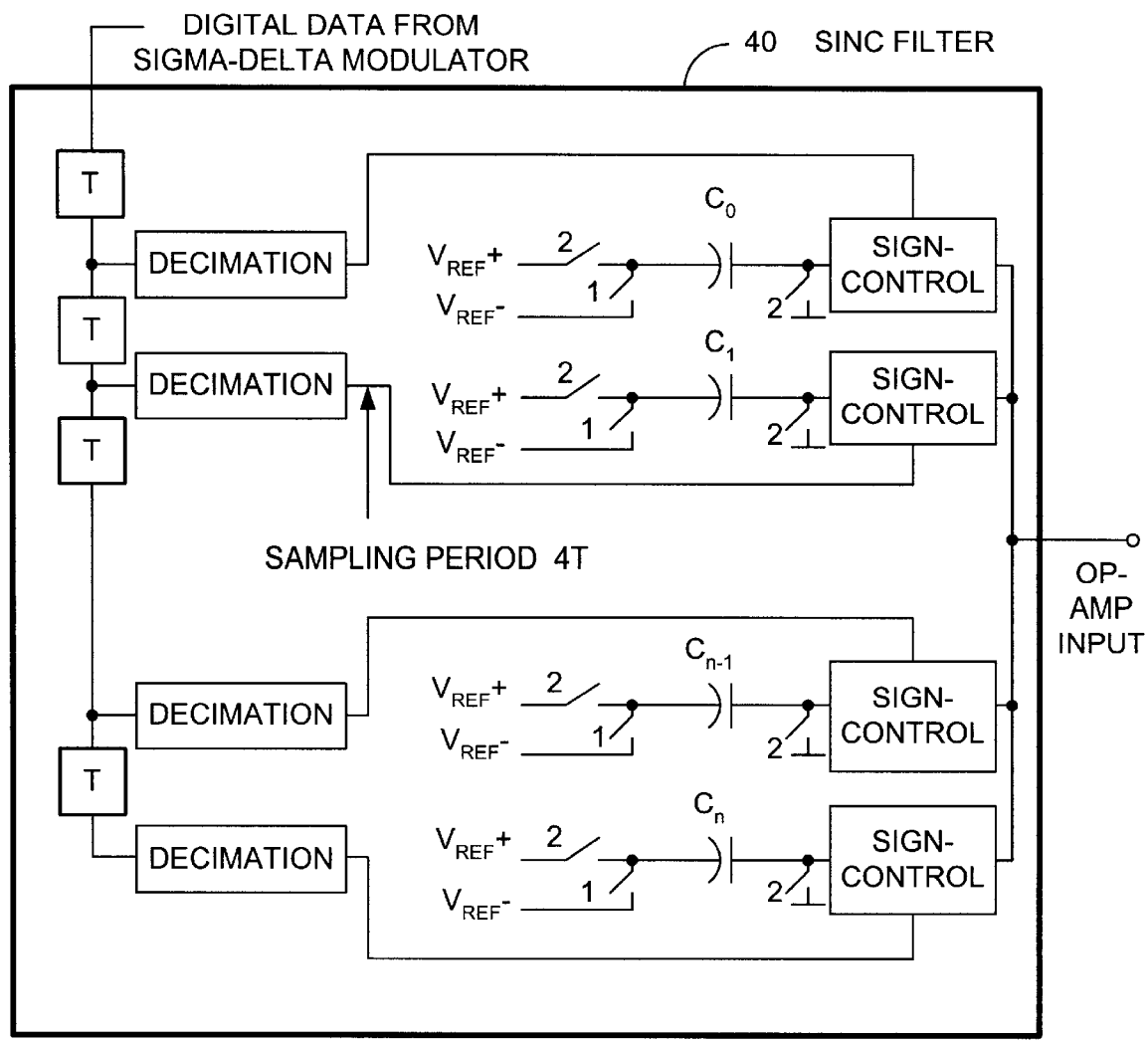
FIG. 4A is a circuit diagram of the SINC filter.

Having briefly described the functional components of SC filter 24, reference is directed to FIG. 4A, which illustrates the SINC filter. The SINC filter 40 receives the digital 1-bit data from the Sigma-Delta modulator and stores the data in a digital delay line. This delay line is updated at the same rate as the modulator. The digital data is decimated by a predetermined factor. FIG. 4A illustrates a SINC filter designated to decimate the input signal by a factor of 4. By decimating the input signal by a factor of 4, the values in the delay line of the filter need only be sampled at one-fourth the rate of the digital Sigma-Delta modulator. The charges on capacitors $C_0$ through $C_n$ are sampled on clock phase 1 and summed on clock phase 2. The clock phases are non-overlapping and have a repetition period corresponding to the lower decimated rate. The sign of the signal transferred from each tap in the SINC filter to the input of the op-amp in the following SC-biquad is controlled by the decimated signal from the digital delay line. For simplicity of illustration, FIG. 4A shows only one channel, but the implementation is fully differential.

Figure 4B:
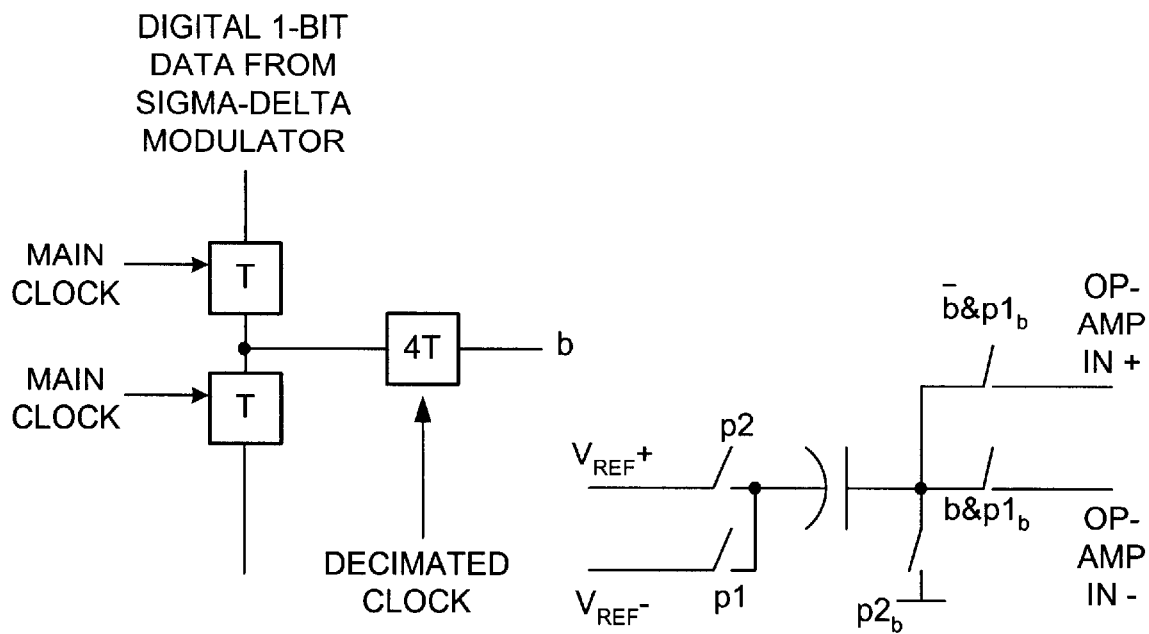
FIG. 4B is a circuit and clock timing diagram further illustrating the operation of the bottom plate switches of the SINC filter.
Figure 4B:
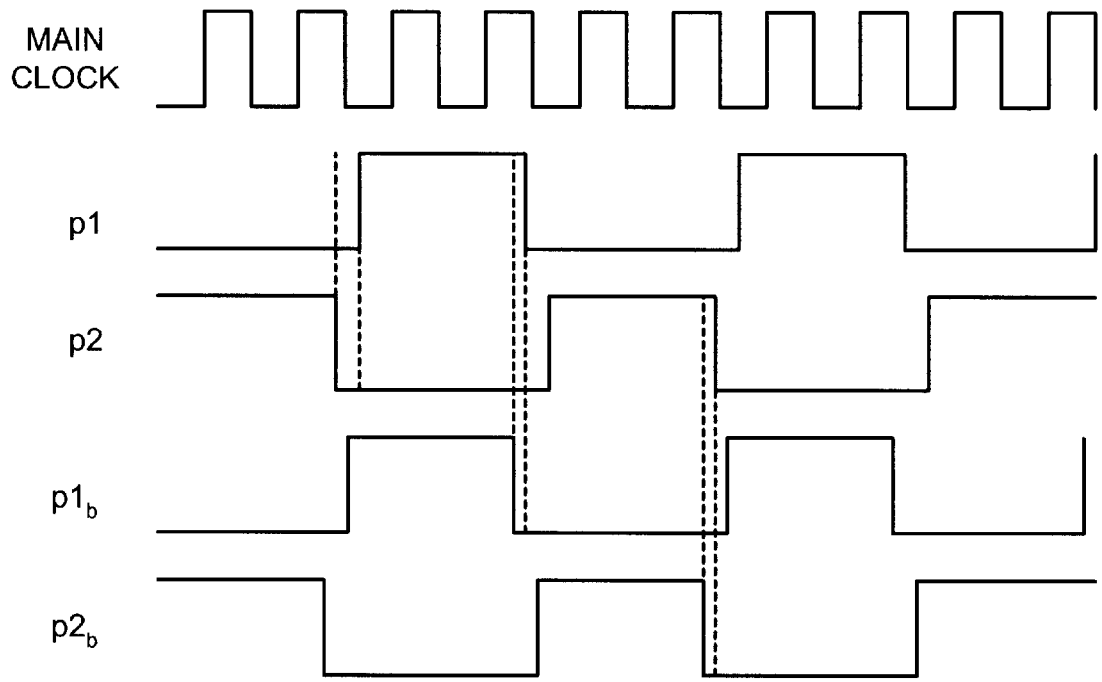

The capacitors in the SINC filter 40 are operated as illustrated in FIG. 4B. The bottom-plate switches of the SINC filter 40 are controlled by the decimated digital data from the digital delay line. P1 and p2 are non-overlapping clock phases. $P1_b$ and $p2^b$ represent clock phases that are turned off slightly before $p_1$ and $P_2$ to enable bottom-plate sampling which reduces the distortion. The top plate of each of the capacitors is switched between $V_{REF}+$ and $V_{REF}-$ to make the effective input signal larger. On clock phase p1, the bottom plate is connected to the positive or negative input of the op-amp in the following SC-biquad 42 depending on the data received from the delay line. Applying the digital data input to the bottom-plate switches makes the load on the reference buffers signal independent.

Figure 5A:
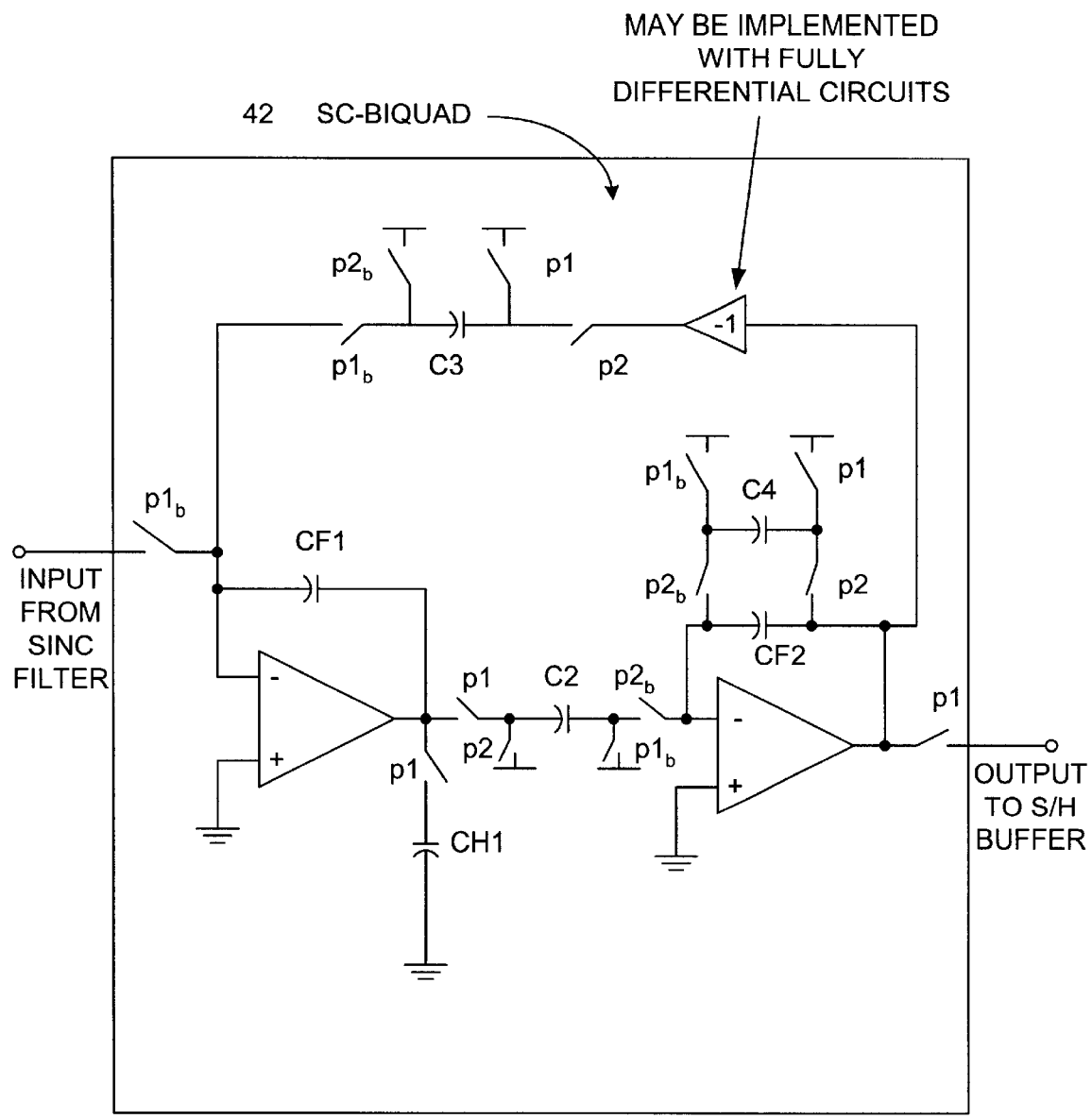
FIG. 5A is a circuit diagram of the SC-biquad.

Having described operation of the SINC filter 40, reference is now directed to FIG. 5A. FIG. 5A illustrates a circuit diagram of the SC-biquad 42. SC-biquad 42 is an example of a switched-capacitor filter that is well known by those skilled in the art. The time constant that determines the frequency response of the SC biquad 42 is determined by the clock period and the capacitance ratio. Since both of these parameters can be well controlled in the integrated circuit manufacturing process, the SC-biquad 42 is particularly suited to high performance applications. Note that the input signal from the SINC filter 40 consists of a charge from each of the switched-capacitors of the SINC filter 40 summed at the input of the SC-biquad 42 on clock phase p1. The output of SC-biquad 42 is applied to the input of the sample and hold buffer 44 on clock phase 1.

Figure 5B:
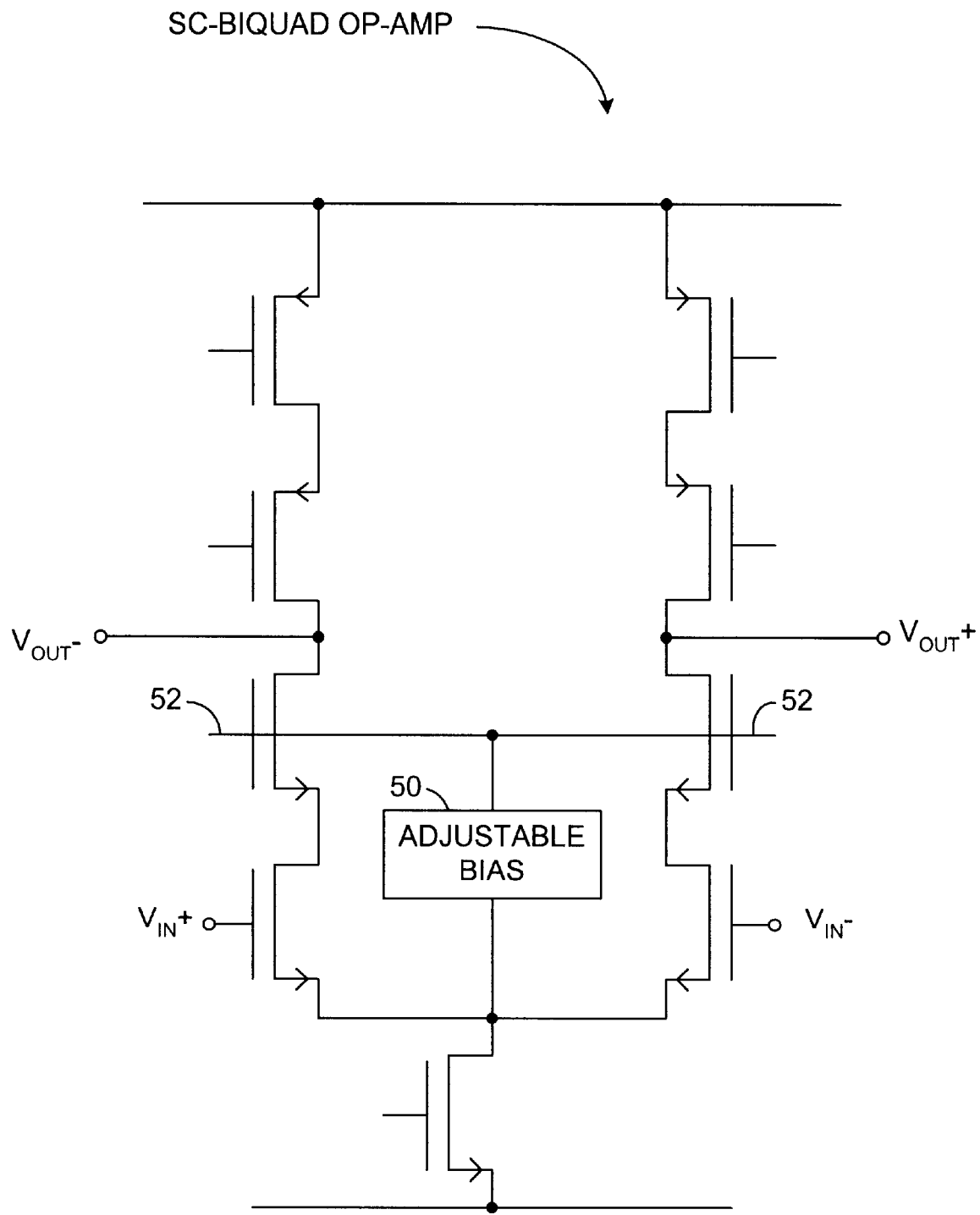
FIG. 5B is a circuit diagram further illustrating the op-amp used in the SC-biquad.

Having described the circuit of the SC-biquad 42 as illustrated in FIG. 5A, reference is now directed to FIG. 5B, which illustrates the op-amp used in the SC-biquad 42. The op-amp in the SC-biquad 42 is a telescopic op-amp with SC-common-mode feedback. The advantage of the telescopic op-amp is that power consumption and thermal noise contributions are small. Note that adjustable bias voltage 50 is responsive to the bias current applied to the op-amp. The bias voltage is applied at the NMOS cascodes 52. The bias current to the SC-biquad is adjusted depending on the bandwidth of the input signal. The bandwidth of the input signal to the SC-biquad 42 will vary depending on the xDSL application.

Figure 6A:
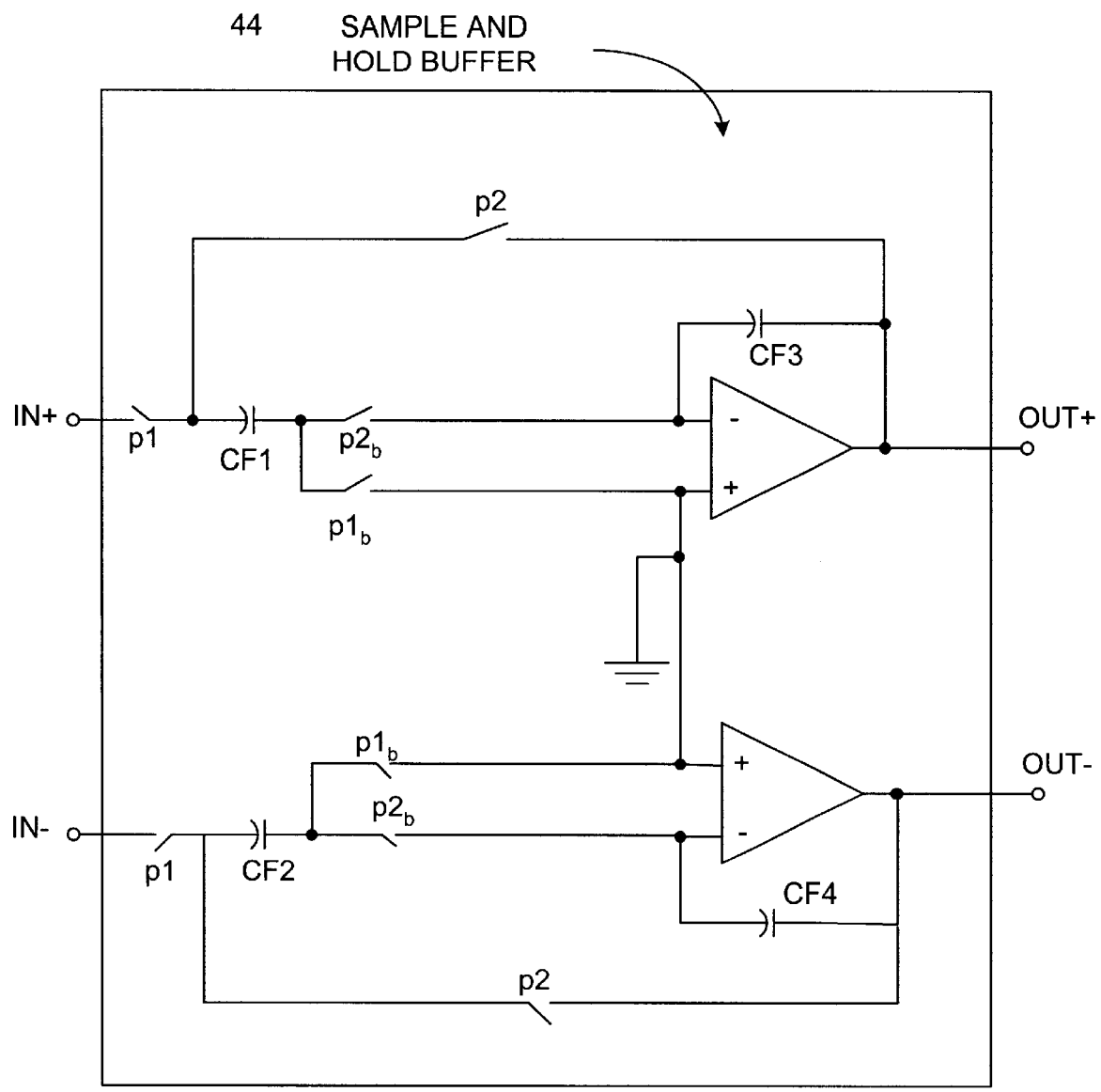
FIG. 6A is a circuit diagram of the sample and hold buffer.
Figure 6B:
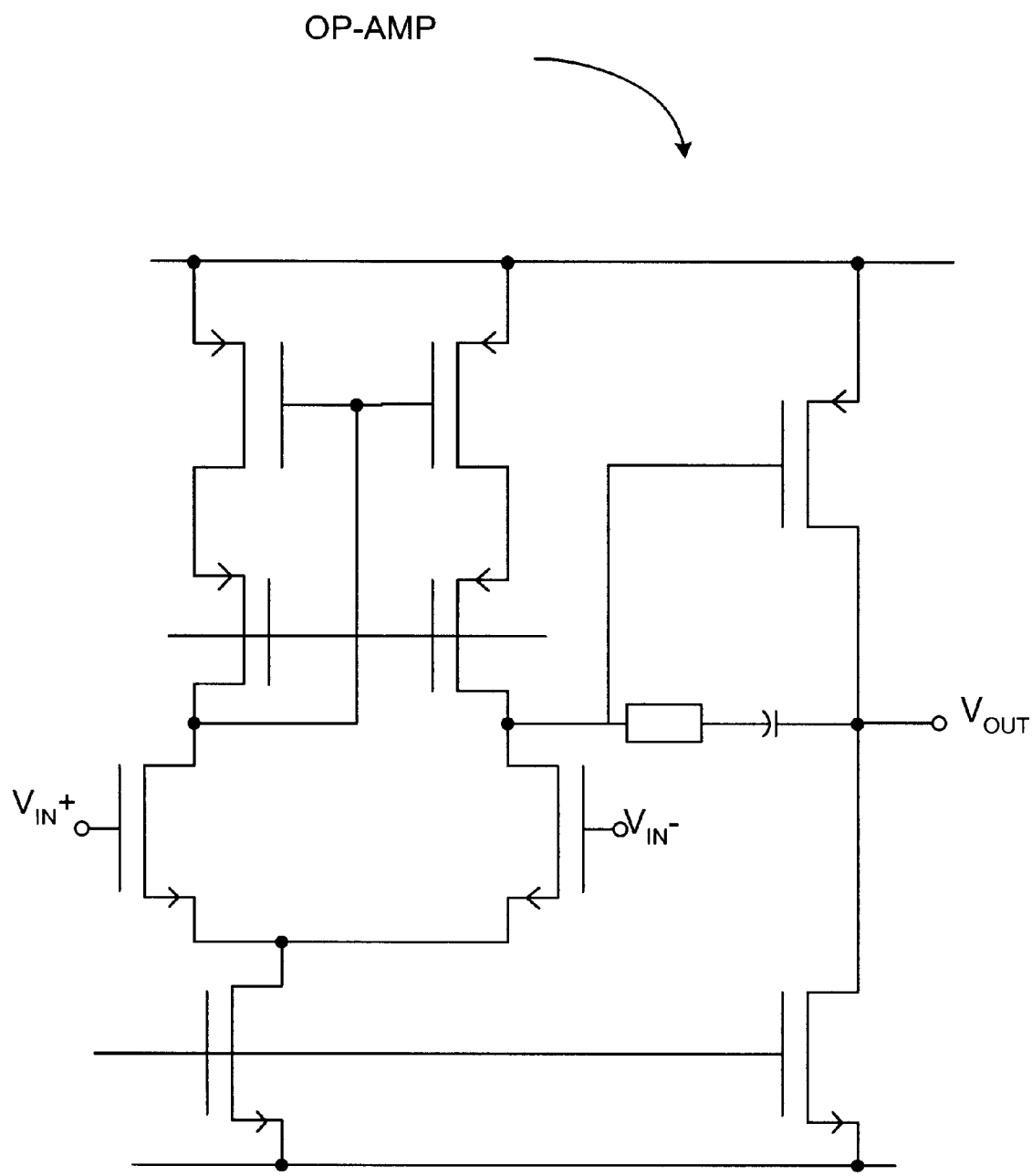
FIG. 6B is a circuit diagram further illustrating the op-amp used in the sample and hold buffer.

Reference is now directed to FIG. 6A which illustrates the sample and hold buffer 44 of the present invention. The sample and hold buffer 44 uses two single-ended output op-amps as shown in the circuit of FIG. 6A. By implementing the switching configuration per the clock phases shown in the figure, a fast charge transfer is achieved with minimal signal distortion. The op-amp used in the sample and hold buffer 44 is a two-stage amplifier with Miller compensation, see FIG. 6B. The two-stage amplifier configuration depicted was selected to drive the resistive load of the smoothing filter 26, without requiring another buffer stage. As a result, power is saved.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Further, since one of ordinary skill in the art is capable of configuring the circuitry necessary to implement the functional features of FIG. 3, the block diagram supplied is a sufficient representation of the preferred embodiment of the invention.

What is claimed is:

1. A filter for oversampling Sigma-Delta digital to analog converter circuits capable of accommodating different digital subscriber line applications, comprising:

a SINC filter that decimates a digital data input signal by a predetermined factor of an over-sampling ratio utilized by a Sigma-Delta modulator and further uses positive and negative reference voltages in combination with bottom-plate switched-capacitors to avoid a signal dependent load on reference buffers;

a switched-capacitor biquad filter having a programmable cut-off frequency which tracks the over-sampling ratio; and a sample and hold buffer.

2. The filter of claim 1, wherein capacitor switching is applied in response to the applicable digital subscriber line application mode.

3. The filter of claim 1, wherein an operational amplifier from the sample and hold buffer is configured to directly drive a smoothing filter.

4. The filter of claim 1, wherein the switched-capacitor biquad filter cut-off frequency is responsive to the applicable digital subscriber line application mode.

5. The filter of claim 1, wherein the SINC filter to switched-capacitor biquad filter interface utilizes one operational amplifier.

6. The filter of claim 1, wherein the switched-capacitance biquad filter contains a telescopic operational amplifier, the telescopic operational amplifier configured with switched-capacitance common mode feedback.

7. The filter of claim 6, wherein the telescopic operational-amplifier is configured to adjust a bias voltage responsive to bias current in the telescopic operational amplifier.

8. The filter of claim 7, wherein the bias voltage is applied to the NMOS cascodes.

9. The filter of claim 1, wherein the sample and hold buffer contains two single-ended output operational transconductance amplifiers with switched-capacitance inputs.

10. A central office digital subscriber line transmission unit utilizing the filter of claim 1.

11. An integrated circuit comprising the filter of claim 1.

12. A method of implementing a switched-capacitor (SC) filter for an over sampling digital to analog converter (OSDAC), comprising the steps of:

decimating a digital signal by a predetermined factor in a SINC filter wherein the SINC filter uses a combination of reference voltages and bottom-plate controlled switched-capacitors to increase signal swing while avoiding signal dependent loads;

applying the decimated digital signal to a switched-capacitor biquad filter; and further applying the output of the switched-capacitor biquad to a sample and hold buffer.

13. The method of claim 12, further comprising the step of:

changing the input data rate of the digital to analog data converter and a sampling rate used to decimate the input data rate in response to different digital subscriber line application modes.

14. The method of claim 13, further comprising the step of:

tracking an over-sampling ratio of a digital Sigma-Delta modulator, thereby providing optimum performance over multiple XDSL modes.

* * * * *